United States Patent [19]

Stiscia

[11] Patent Number: 5,402,433
[45] Date of Patent: Mar. 28, 1995

[54] APPARATUS AND METHOD FOR LASER BIAS AND MODULATION CONTROL

[75] Inventor: James J. Stiscia, Garner, N.C.

[73] Assignee: Alcatel Network Systems, Inc., Richardson, Tex.

[21] Appl. No.: 177,845

[22] Filed: Jan. 5, 1994

[51] Int. Cl.$^6$ .............................................. H01S 3/10
[52] U.S. Cl. ........................................ 372/31; 372/26; 372/38
[58] Field of Search .................... 372/26, 38, 29, 31

[56] References Cited

U.S. PATENT DOCUMENTS

| | | | |
|---|---|---|---|
| 4,677,632 | 6/1987 | Lisco et al. | 372/26 |
| 5,224,112 | 6/1993 | Uesaka | 372/38 |
| 5,268,916 | 12/1993 | Slawson et al. | 372/38 |

*Primary Examiner*—James W. Davie
*Attorney, Agent, or Firm*—Baker & Botts

[57] ABSTRACT

The apparatus (10) includes a laser driver (16) that receives low speed and high speed digital and analog input signals (12, 14), and biases and modulates the laser diode (22) accordingly. The laser driver (16) receives and responds to input from a feedback circuit (36, 38), which includes an average power control portion (36), and a modulation power control portion (38). The average power control portion (36) of the feedback circuit generally determines the DC component of the laser diode output, and compares it to a reference average. The modulation power control portion (38) of the feedback circuit generally determines the maximum and minimum peaks in the laser diode output, takes their average and compares the average to the DC component of the laser output from the average power control portion (36). The laser diode (22) is then driven by the laser driver (16) in response to the comparisons.

16 Claims, 6 Drawing Sheets

APPARATUS AND METHOD FOR LASER BIAS AND MODULATION CONTROL

TECHNICAL FIELD OF THE INVENTION

This invention relates in general to the field of transmission of information on optical fibers. More particularly, the present invention relates to apparatus and a method for laser bias and modulation control for an hybrid telephony and video telecommunications system.

BACKGROUND OF THE INVENTION

In the field of telecommunications, laser diodes have been used to generate intensity-modulated light pulses for transmission on optical fibers. Such laser diodes are operated and controlled by a DC bias current and a modulation current to intensity-modulate the laser diode about a DC bias point. However, laser characteristics may change in a number of ways. The operation and optical output power of the laser diodes tend to be sensitive to variations in ambient temperature and age of the component. For example, the laser threshold of the laser diode typically increases with increasing temperature and age. Therefore, to maintain a constant average optical power output, the DC bias current must be increased. In addition, the efficiency of the conversion of signal modulating electrical current to optical power, also known as slope efficiency, tends to decrease with increasing temperature. As a result, to maintain the same slope efficiency or constant peak-to-peak optical signal power, the modulation current must also be increased. FIG. 1 illustrates these known relationships between the laser diode optical power output and temperature.

In most fiber optics applications, both the average optical power output and peak-to-peak optical signal power output the laser diode must be relatively constant despite the ambient temperature reading or the age of the diode. One solution to the temperature variation problem is to attempt to maintain the temperature of the laser diode by insulation and thermo-electric cooling. However, the added cost, power consumption and bulk are unfeasible for high-volume, low-cost applications. Another solution provides expected performance curves based on temperature readings and/or age. Due to variations inherent in laser diodes, the assumption that all laser diodes operate similarly under the same conditions is unrealistic and produces inaccurate performance predictions.

The constant optical average and peak power requirements are even more important in systems where both lower speed digital signals and high speed frequency division multiplexed digitally encoded signals are transmitted via optical fibers. An example of such a system is a fiber-to-the-curb system where both telephony channels and switched video channels are transported. Optical transmission systems carrying switched video signals require a number of parameters to be held constant for satisfactory performance. These parameters include optical average and peak power as well as recovered signal linearity.

When the modulation current approaches or goes below the laser threshold, a phenomenon known as clipping arises. FIG. 2 illustrates clipping of the composite signals with frequency ranging from zero to approximately 600 MHz, for example. It is apparent from FIG. 2 that when clipping occurs, an asymmetric output waveform with severe distortions is produced. When clipping is experienced in a system transporting high frequency signals, such as switched video signals, the carrier-to-distortion ratio of the recovered signal decreases. The result is degraded optical link performance or complete signal loss. The degradation and signal loss are especially traumatic in systems with high efficiency modulation schemes. Therefore, a perfect video image at one instant may deteriorate very quickly the next.

In U.S. Pat. No. 5,268,916 to Slawson et al., a control system is provided to control the laser output over a wide temperature range by monitoring the output of the laser diode. However, in this circuit, the clipping phenomenon cannot be detected and avoided. Therefore, should the laser high speed source amplitude increase excessively, the modulation current would drive the laser diode below the threshold where it operates as a light emitting diode or LED. This results in severe distortion of both the high speed and low speed signal output signals from the laser diode and the unacceptable degradation or loss of the recovered signal.

SUMMARY OF THE INVENTION

In accordance with the present invention, apparatus and a method for laser bias and modulation control are provided which substantially eliminate or reduce disadvantages and problems associated with prior systems.

In one aspect of the present invention, the apparatus includes a laser driver that receives the low speed and high speed digital and analog input signals, and biases and modulates the laser diode accordingly. In addition, the laser driver receives and responds to input from a feedback circuit, which includes an average power control portion, and a modulation power control portion.

The average power control portion of the feedback circuit generally determines the DC component of the laser diode output, and compares it to a reference average. The modulation power control portion of the feedback circuit generally determines the maximum and minimum peaks in the laser diode output, takes their average and compares the average to the DC component of the laser output from the average power control portion. The laser diode is then driven by the laser driver in response to the comparisons.

In another aspect of the present invention, a back facet monitor diode is used to monitor the laser diode output. A current-to-voltage converter then takes the output from the back facet diode and converts it to a voltage level. This voltage level is provided to the average power control portion and the modulation power control portion of the feedback circuit.

In yet another aspect of the present invention, a method to bias and control the laser diode includes the steps of receiving low and high speed, digital and analog input signals. These input signals include a hybrid digital and analog signals in the form of frequency division multiplexed signals. The laser diode is driven by a laser driver according to the input signals, and the output of the laser diode is monitored. The laser diode output is provided to a feedback control circuit which determines the average, and the maximum and minimum peaks of the laser diode output. These parameters are then compared with predetermined reference values. The laser driver thus biases and modulates the laser diode in accordance with the comparisons.

An important technical advantage of the present invention provides apparatus and method for monitoring and preventing clipping and kinking. The laser is thus capable of providing a constant output regardless of temperature variations and aging components. As a result, high frequency signals including switched video signals may be satisfactorily transmitted via optical fibers.

BRIEF DESCRIPTION OF THE DRAWINGS

For a better understanding of the present invention, reference may be made to the accompanying drawings, in which.

DETAILED DESCRIPTION OF THE INVENTION

Figure 1:
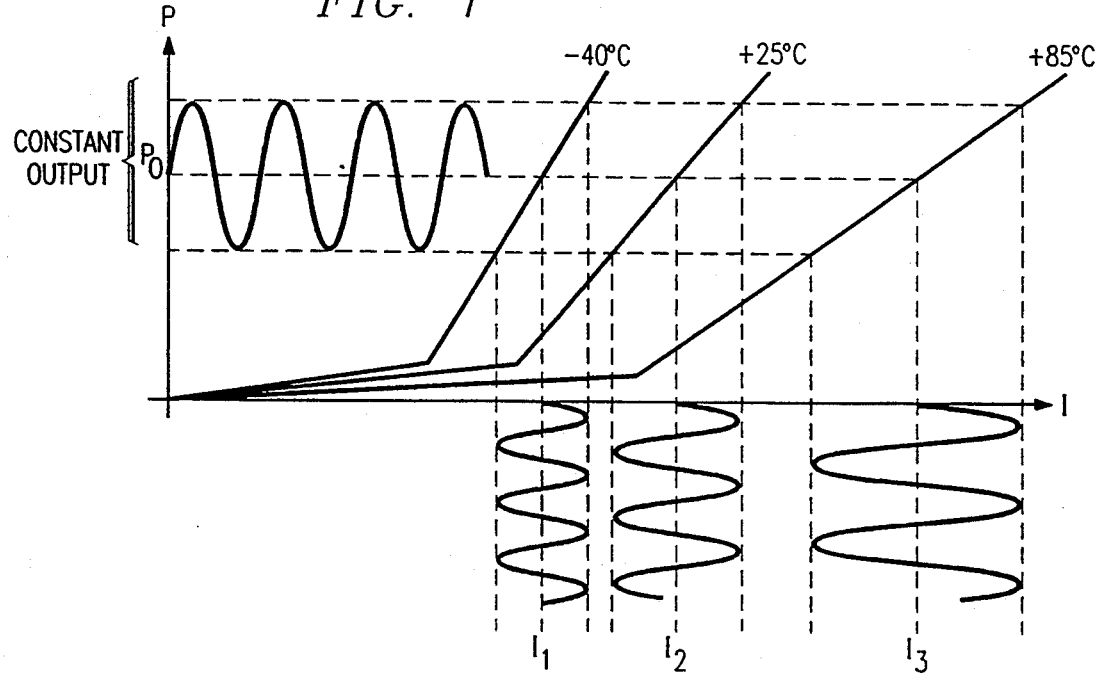
FIG. 1 is a graph of the relationship between laser bias and modulation amplitude and temperature variations.
Figure 2:
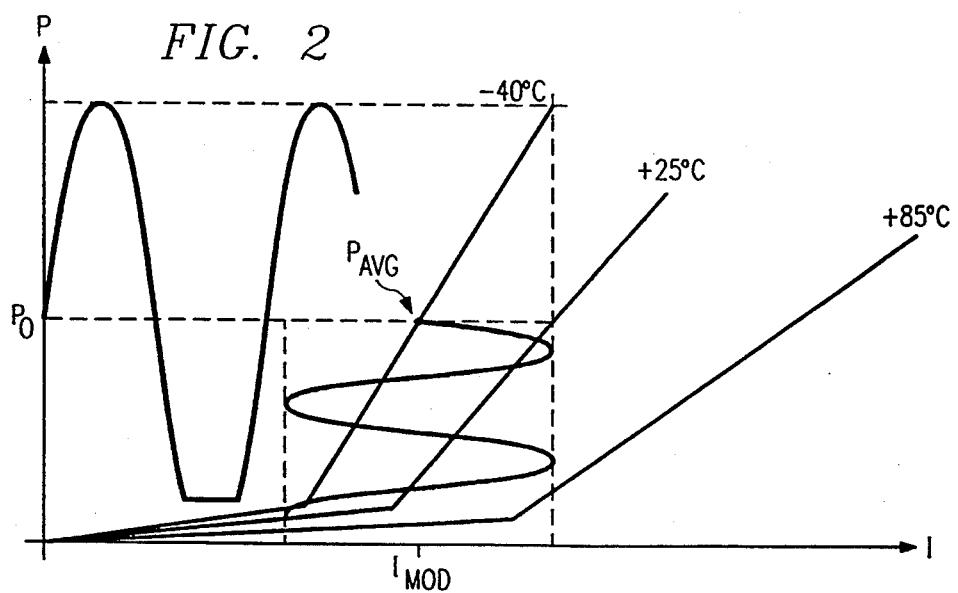
FIG. 2 is a graph showing the phenomenon of clipping.
Figure 3:
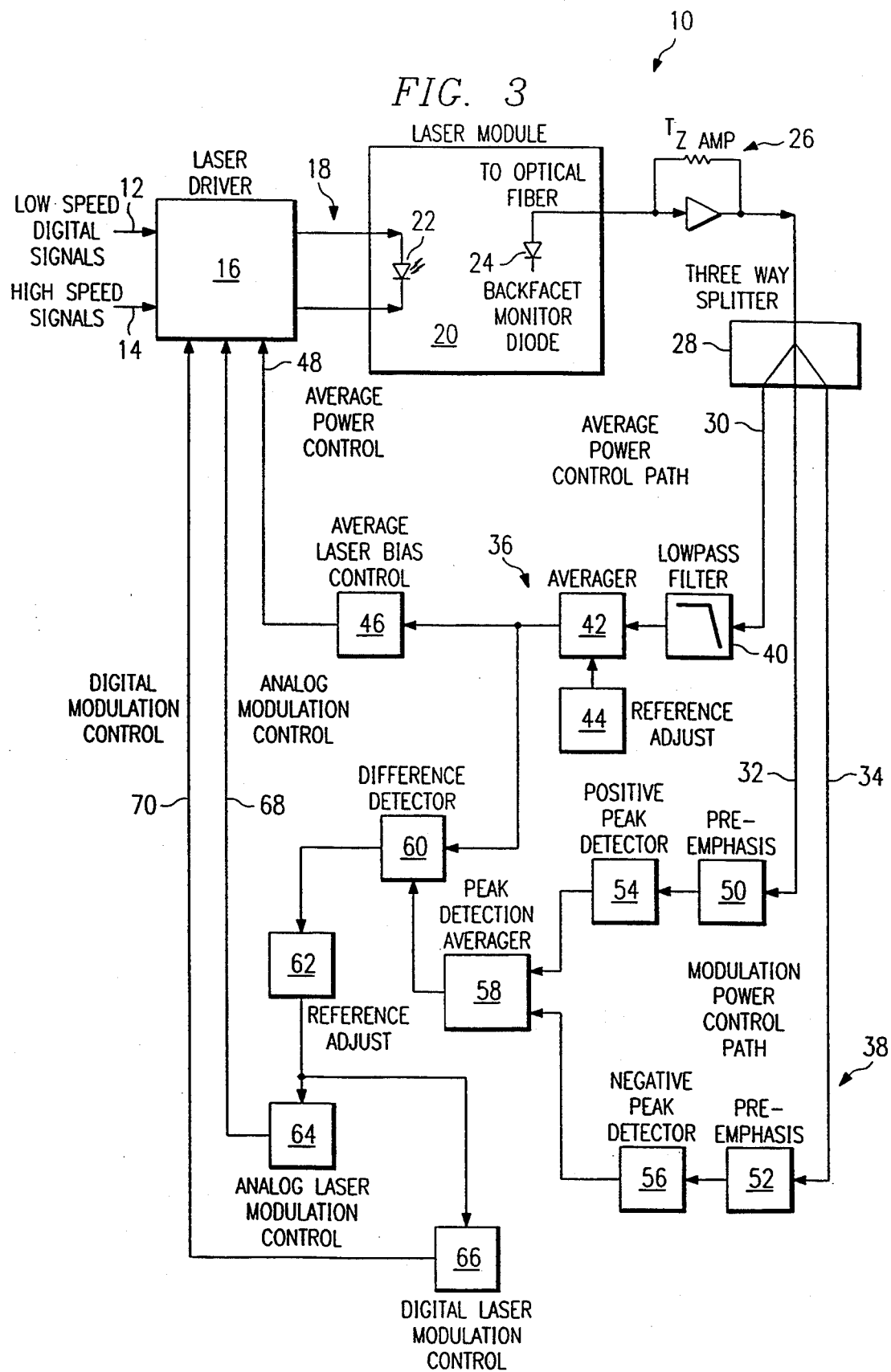
FIG. 3 is a top-level block diagram of the apparatus and method for laser bias and modulation control.

With reference to the drawings, FIG. 3 illustrates a top level block diagram of apparatus for laser bias and modulation control, indicated generally at 10 and constructed according to the teaching of the present invention. In general, apparatus for laser bias and modulation control 10 monitors the output of the laser diode 22, provides it to a feedback circuit, compares the outputs of the feedback circuit to references voltages or signals, and forces the output of the feedback circuit to equal the reference voltages in response to the comparison to avoid clipping and kinking in the operation of the laser diode. In particular, the average bias signals and the modulation signals are monitored and controlled in this manner.

Referring to FIG. 3, apparatus for laser bias and modulation control 10 receives hybrid digital and analog signals in the form of a frequency division multiplexed signal. The hybrid signals are shown as low speed digital signals 12 and high speed signals 14 at the input of a laser driver 16. In particular, the input signal components include low speed baseband digital sequences at approximately 20 megabaud, for example, and high frequency RF signals, ranging approximately 50 to 1000 MHz, for example. The high frequency RF signals may be in either analog or digitally modulated carrier formats.

Laser driver circuit 16 is responsive to the frequency division multiplexed signal and provides a laser drive current 18 for a laser module 20. Laser module 20 includes a laser diode 22 which provides a light output to an optical fiber (not shown) for transmission through a communication network from its front facet and also transmits light into a monitor photodiode 24 through its back facet. Laser driver 16 intensity-modulates laser diode 22 about a bias current level in such a manner as to not drive the laser below the lasing threshold, a phenomenon commonly called clipping. Laser diode 22 is also controlled in such a manner as to not operate laser diode 22 in a region of operation where distinct changes in slope efficiency occur, a phenomenon commonly called kinking.

A low input impedance current-to-voltage converter shown as a transimpedance amplifier (Tz amp) 26 is coupled to monitor photodiode 24 and converts a sample current therefrom into a voltage proportional to the laser light produced by laser diode 22. The output voltage contains the sum of all Fourier components including low and high frequency signals. A three-way splitter 28 coupled to transimpedance amplifier 26 divides the transimpedance amplifier output signal into three signals each having one-third power of the transimpedance amplifier output. In particular, three-way splitter provides an output port contains a composite DC/digital/analog signal 30 and two AC coupled ports contains digital/analog signals 32 and 34 for further signal analysis and processing. Composite DC/digital/analog signal 30 is provided to an average power control path or circuit 36 and digital/analog signals 32 and 34 are provided to a modulation power control path or circuit 38.

Average power control path 36 includes a lowpass filter coupled to an averager circuit 42, which also receives input from a reference adjust circuit 44. Lowpass filter 40 primarily filters out the majority of the modulating signals from digital and analog signals 30. In addition, lowpass filter 40 provides an impedance match between the low characteristic impedance of three-way splitter 28 and the high impedance of averager circuitry 42.

Averager 42 is an integrator/comparator which compares the filtered transimpedance amplifier output voltage with a reference voltage provided by reference adjust circuit 44. If the reference voltage is greater than the filtered transimpedance amplifier output voltage, the average laser drive power is increased. If, on the other hand, the reference voltage is less than the filtered transimpedance amplifier output voltage, the average laser drive power is decreased. The reference voltage required is defined as a function of the monitor photodiode current, the transimpedance amplifier gain, and the desired average laser optical output power. In general, the monitor photodiode current output for a given laser output power is defined by the manufacturer of laser module 20, and the other two parameters are then set accordingly.

An Average laser bias control circuit 46 is coupled to averager 42 and receives an input therefrom indicative of the desired average laser drive power. Laser diode 22 in laser module 20 is controlled by the output of average laser bias control 46 accordingly.

Also coupled to three-way splitter 28 as a part of modulation power control path 38 are two pre-emphasis circuits 50 and 52. Pre-emphasis circuits 50 and 52 in effect pre-distorts the signals to ensure that the frequency response of positive and negative peak detection circuits 54 and 56 is the same for all frequencies. Pre-emphasis circuit 50 receives digital/analog signals 32 from three-way splitter 28 and generally provides compensation for the loss the high frequency analog RF signals experience in the feedback loop. The loss is implementation specific and may be the result of the use loss dielectric printed circuit board material and low cost detection diodes in a positive peak detector 54 and a negative peak detector 56 coupled to pre-emphasis circuits 50 and 52. The analog RF and digital input signals are also amplified in the process of applying the gain slope.

Positive and negative peak detection circuits 54 and 56 measure the maximum and minimum absolute voltage levels of the composite digital/analog converted signals 32 and 34, respectively. Positive and negative peak detectors 54 and 56 generates output voltages which are provided to a peak detection averager circuit 58. Peak detection averager circuit 58 averages the output voltages to find a midpoint voltage. The resultant signal may be summarized by the equations:

$$m = \frac{P_H - P_L}{2P_{avg}} \quad (1)$$

or $$mP_{avg} = \frac{P_H - P_L}{2}, \quad (2)$$

where $P_H$ and $P_L$ are positive (maximum) and negative (minimum) peaks from positive and negative peak detectors 54 and 56, the relation $(P_H-P_L)/2$ finds the midpoint of the peak detectors, $mPAV_G$ is the value the optical feedback circuit adjust the peak detection output $(P_H-P_L)/2$ to be equal to.

The midpoint voltage from peak detection averager circuit 58 is provided to a difference detector circuit 60. Difference detector circuit 60 also receives the average power voltage from averager 42 of average power control path 36. Difference detector 60 finds the difference between the average power and the averaged modulation power and provides it to a reference adjust circuit 62. In effect, the output from averager 42 of average power control path 36 is used as the reference voltage for difference detector 60 in this determination.

The output from difference detector 60 is conditioned by reference adjust circuit 62, and analog and digital laser modulation circuits 64 and 66 so that the signal is suitable for use by laser drivers 16. The conditioned analog and digital modulation control output signals 68 and 70 from analog and digital laser modulation circuits 64 and 66, respectively, are then provided to laser driver 16 along with average power control signal 48 from average laser bias control circuit 46.

Constructed in this manner, apparatus for laser bias and modulation control 10 is capable of maintaining a constant and linear output power from a low cost laser despite varying ambient temperature and component aging. In addition, clipping and kinking phenomena in laser operation may be monitored and corrected.

Figure 4:
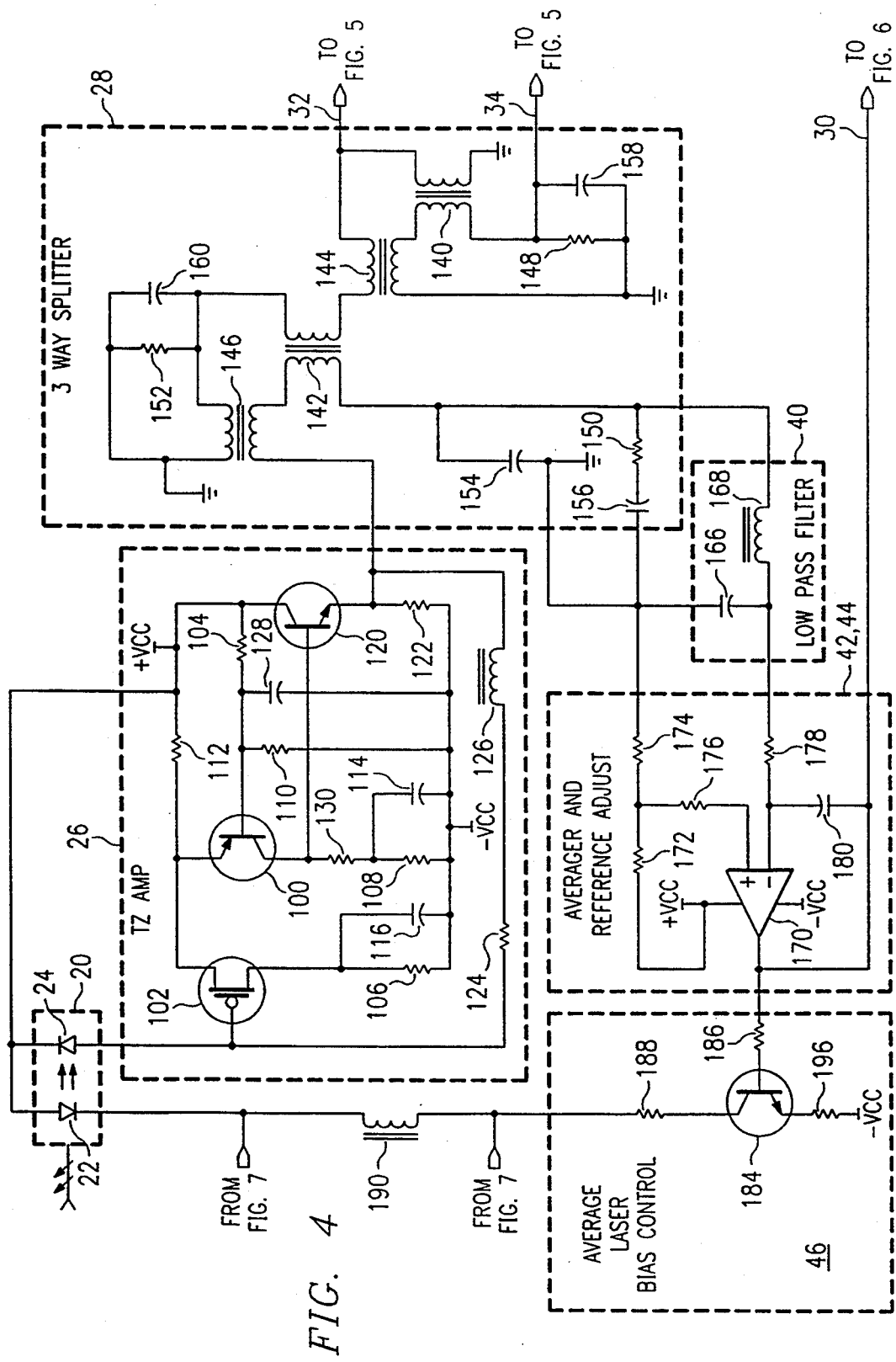
FIG. 4 is a detailed exemplary schematic diagram of the laser module, average laser bias control, transimpedance amplifier, averager and reference adjust, lowpass filter, and three-way splitter circuit blocks.

FIGS. 4-7 are more detailed schematic diagrams of an embodiment of apparatus for laser bias and modulation control 10. Referring first to FIG. 4, laser module 20 includes laser diode 22 which generates and transmits light to an optical fiber (not shown) and back facet monitor photodiode 24. Monitor photodiode 24 receives the light and generates a proportional sample photo current. Transimpedance amplifier 26 is coupled to monitor photodiode 24 to receive the photo current.

Low input impedance transimpedance amplifier 26 includes transistors 100 and 102, resistors 104-112, and capacitors 114 and 116, which form a cascade amplifier. The cascade amplifier configuration is particularly useful for high-frequency applications for its good gain, high bandwidth, and input/output isolation. A transistor 120 and resistor 122 form a buffer amplifier for the cascade stage. A resistor 124 and an inductor 126 apply feedback which sets the gain and frequency response of transimpedance amplifier 26. Transimpedance amplifier 26 further includes a capacitor 128 coupled in parallel with resistor 110 and a resistor 130 coupled in series with resistor 108.

Coupled to transimpedance amplifier 26 is a transformer-based three-way splitter 28. Three-way splitter 28 includes transformers 140-146, resistors 148-152, and capacitors 154-160. It is known that such a splitter may also be resistor-based, the implementation details thereof is not described herein.

Average power control path 36 receiving a first output of three-way splitter 28 and provides it to lowpass filter 40. Lowpass filter 40 includes a capacitor 166 and an inductor 168.

Coupled to lowpass filter 40 is averager circuit 42 and reference adjust circuit 44. Averager 42 and reference adjust 44 include an operational amplifier 170 coupled to resistors 172-176 at its noninverting input terminal, and a resistor 178 and a capacitor 180 at its inverting terminal. Averager 42 and reference adjust 44 are coupled to average laser bias control circuit 46, which are formed by a transistor 184 and resistors 186-190.

Averager 42 in effect compares the filtered transimpedance amplifier output voltage with a reference voltage determined at the junction of resistors 172 and 174. If the reference voltage is greater than the filtered transimpedance amplifier output voltage, the average laser drive power is increased by forcing more current through resistor 184 into the base terminal of transistor 186, and vice versa. The resultant average bias control current is applied to laser module 20 through an inductor 190. Recall that the reference voltage required is a function of the monitor photodiode current, the transimpedance amplifier gain, and the desired average laser optical output power, where the monitor photodiode current is a known value obtained from the laser module manufacturer.

Figure 5:
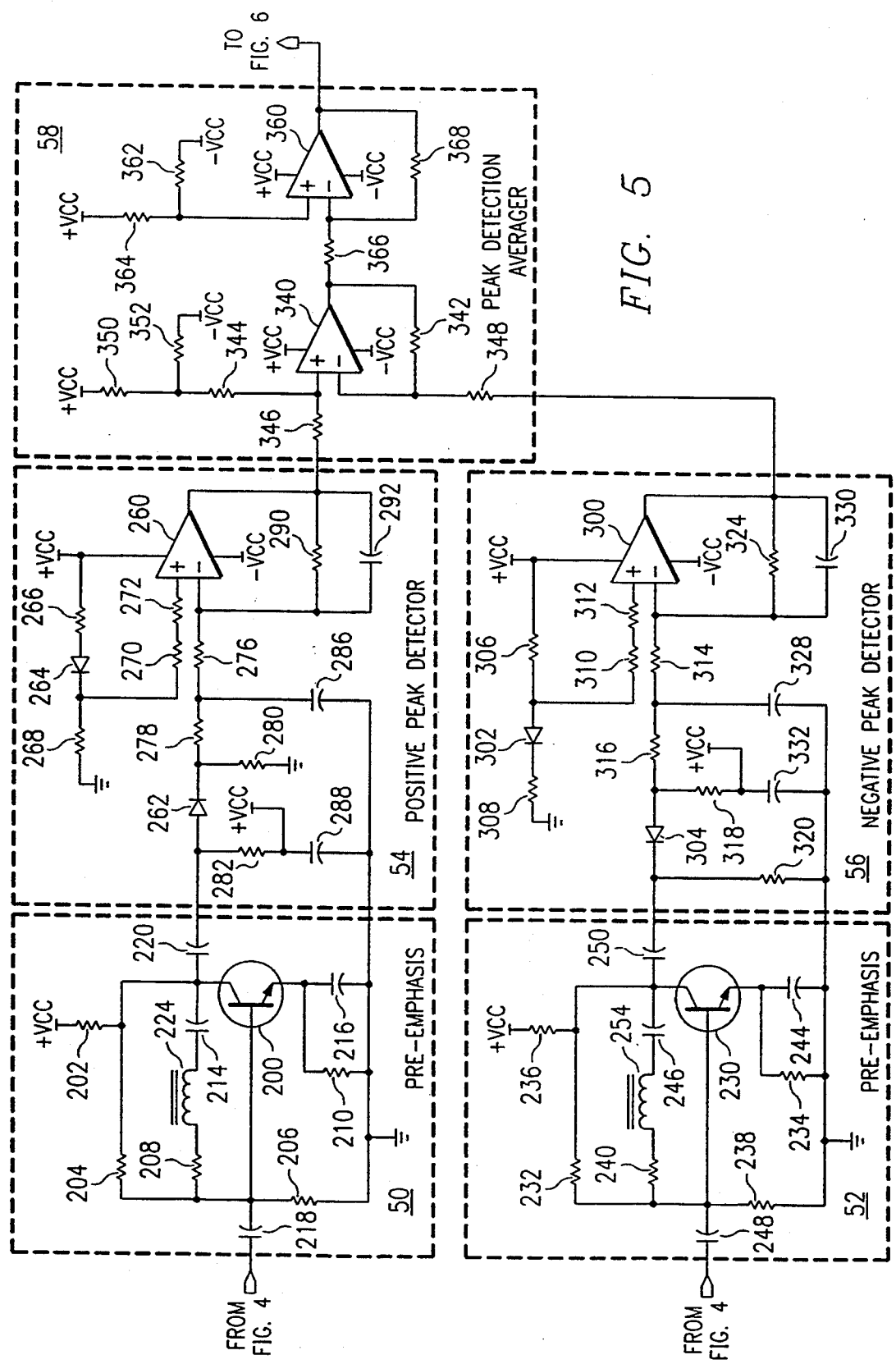
FIG. 5 is a detailed exemplary schematic diagram of the pre-emphasis, peak detector, and peak detection averager circuit blocks.

Referring also to FIG. 5, an embodiment of modulation power control path 38 is shown. Pre-emphasis circuit 50, coupled to a second output of three-way splitter 28, includes a transistor 200, resistors 202-210, capacitors 214-220, and an inductor 224. Pre-emphasis circuit 50 in effect forms a gain-sloped negative feedback amplifier for the positive peak detection signal path. The gain is set by resistors 208 and 210, while the gain slope, where increasing gain as the signal frequency increases, is set by inductor 224 and capacitor 216. The negative peak detection path similarly operates with pre-emphasis circuit 52 that includes a transistor 230, resistors 232-240, capacitors 244-250, and an inductor 254.

The circuit implementation of positive peak detector 54 may be similar to that of negative peak detector 56. Positive peak detector 54 includes an operational amplifier 260, diodes 262 and 264, resistors 266-272 coupled to the noninverting input terminal of operational amplifier 260, resistors 276-282 and capacitors 286 and 288 coupled to the inverting input terminal of operational amplifier 260, and a resistor 290 and a capacitor 292 forming a feedback loop from the operational amplifier's 260 output to the inverting input terminal. Negative peak detector 56 includes an operational amplifier 300, diodes 302 and 304, resistors 306–324, and capacitors 328–332.

The response times of both detectors 54 and 56 are set according to the signal component of the frequency division multiplex that has the longest duration between transitions. Accordingly, the lower frequency digital signal determines the longest time constant required of peak detectors 54 and 56. For example, where the longest time between transitions is on the order of 244 nanoseconds, the resistive value for resistor 280 may be 162KΩ, for both resistors 282 and 278 may be 75Ω, and the capacitive values for capacitors 288 and 286 may be 0.47µf and 82 pf, respectively.

In operation, operational amplifier 260 amplifies the detected signals and provides temperature and power supply variation compensation. Resistors 276 and 290, and capacitor 292 with operational amplifier 260 integrate and amplify the detected peak signal level. It should be noted that the time constant of integration is much less than the above-described longest time between transitions in the frequency multiplex signal to prevent inadvertent interaction therebetween. The operational amplifier reference voltage is determined by the values of diode 264 and resistors 266, 268, 270, and 272. The operational amplifier reference voltage is responsive to and compensates for temperature variations and power supply variations. Negative peak detector 56 operates in a similar manner.

The output of both peak detector circuits 54 and 56 are provided to peak detection averager circuit 58 which determines a midpoint voltage from the maximum and minimum detected values. Peak detection averager 58 includes an operational amplifier 340 and resistors 342–352, which serve to provide amplification and DC level shifting of the positive and negative peak detector output voltages. Operational amplifier 360, resistors 362–366, and a resistor 368 provide further amplification, DC level shifting, and inversion of the peak detector output voltages.

Figure 6:
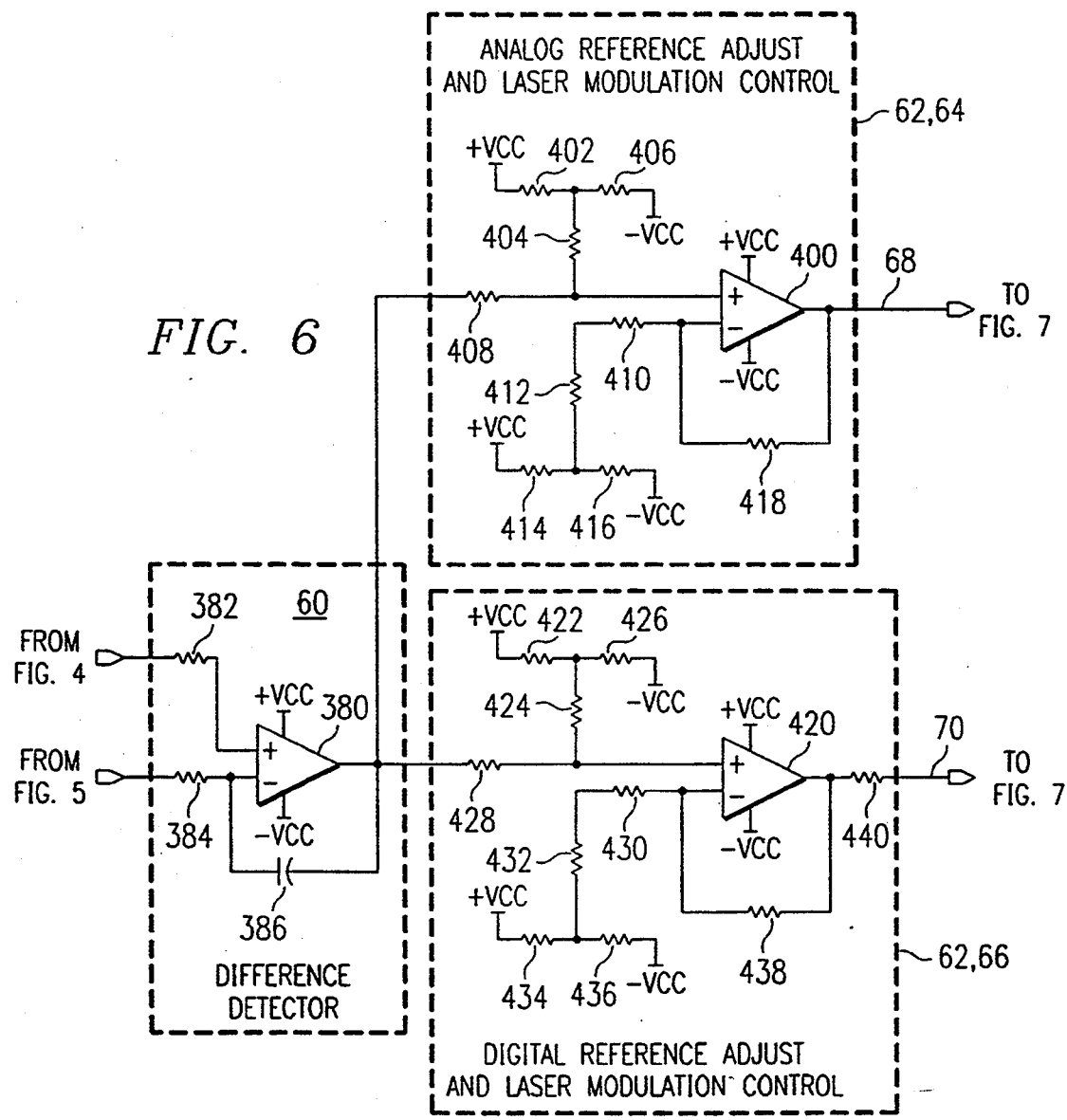
FIG. 6 is a detailed exemplary schematic of the difference detector, analog and digital reference adjust and laser modulation control circuit blocks.

The output from peak detector averager 58 is provided to difference detector 60 along with the output from averager 42 of the average power control path 36. The difference between the average power and the averaged modulation power is determined by difference detector 60. Referring to FIG. 6, difference detector 60 may include an operational amplifier 380, resistors 382–384, and a capacitor 386 coupled in a noninverting configuration.

Constructed in this manner, the output from averager 42 is used as the reference voltage for difference detector 60 and applied through resistor 382 to the noninverting input of operational amplifier 380. The reference voltage is compared to the peak detection averager output voltage of the modulation power control path. The modulation power control path peak detection average voltage is applied to resistor 384. Operational amplifier 380, resistors 384 and 382, and capacitor 386 of peak detection averager 58 act to force the modulation control peak detector averaged voltage to equal the average power control path average voltage. In this manner, linear laser operation is achieved.

The difference detector output is first conditioned by analog and digital reference adjust and modulation control circuits 62–66 before providing it to laser driver 16. Analog reference adjust and laser modulation control circuit 62 and 64 include an operational amplifier 400, and resistors 404–418. Similarly, an operational amplifier 420 and resistors 422–440 form the digital counterpart circuit 62 and 66.

Figure 7:
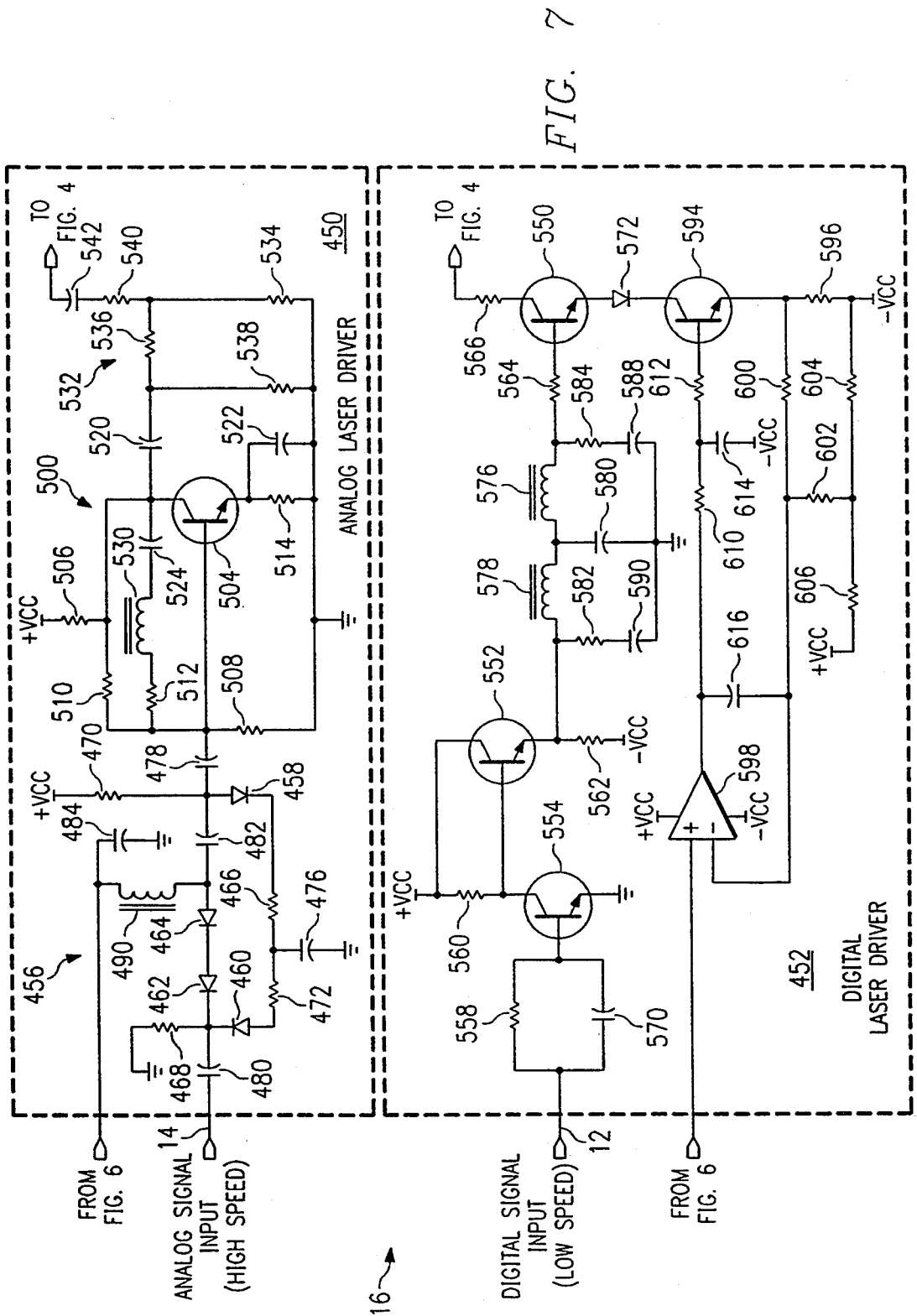
FIG. 7 is a detailed exemplary schematic diagram of the analog and digital laser driver circuit blocks.

An embodiment of laser driver 16, divided into an analog laser driver 450 and a digital laser driver 452, is shown in FIG. 7. Laser driver 16 is best described by specifying the control currents generated by laser driver 16. The laser driver circuitry consists of two main subsections. Recall that average laser bias control 46, shown in FIG. 4, provides an average bias control current through inductor 190 to laser module 20. Inductor 190 acts as an RF choke to force RF modulating currents through laser diode 22. Along with the average bias control current, laser driver 16 generates a digital laser driver modulation current and an analog laser driver modulation current.

The analog laser driver modulation current is generated by analog laser driver 450. The high speed analog input signal 14, assumed to have been highpass filtered, is first adjusted by an impedance matched pin diode attenuator circuit 456 of analog laser driver 450. Diodes 458–464, resistors 466–472, capacitors 476–484, and an inductor 490 form current controlled attenuator 456. After being adjusted by attenuator 456, the analog input signal is amplified by a broadband negative feedback amplifier 500, with a bandwidth of 50 to 1000 MHz, for example. As shown, amplifier circuit 500 includes transistor 504, resistors 506–514, capacitors 520–524, and an inductor 530. It should be noted that the amplifier gain response may be made to yield increased gain at higher frequencies and thus be used to correct for low cost laser relative intensity noise increase with increasing modulation frequency.

The output from amplifier 500 may then be impedance matched through a resistive attenuator 532 comprising 534–538. The resultant voltage is then converted to current by resistor 540 and capacitor 542 before application to laser diode 22.

The digital laser driver modulation current is applied through digital laser driver 452. The low speed input digital signal 12 is "squared up" and DC level shifted through by a circuit configuration including transistors 550–554, resistors 558–566, a capacitor 570, and a diode 572. The signal is then filtered by a lowpass filter formed by inductors 576 and 578 and a capacitor 580 to remove high frequency signal components from the RF spectrum. In addition, resistors 582 and 584, and capacitors 588 and 588 and 590 aid in providing AC terminations for the lowpass filter.

Transistor 594 is used to control the digital modulating current level. The modulating current is sensed across a resistor 596 and a portion of the resultant voltage is fed to an operational amplifier 598 through resistors 600–606. This voltage level is compared to the digital modulation control signal, which is provided to the noninverting input of operational amplifier 598, and transistor 594 is forced to adjust the modulating current as required by drive application through resistors 610 and 612, and capacitors 614 and 616.

Constructed in this manner, the optical transport system may operate at the optimal modulation index. Therefore, the carrier to noise ratio is maximized, and the laser transmitter distortion interference is minimized. In addition, full laser transmitter performance may be directly monitored and measured by examining the levels of feedback in the apparatus. The instant apparatus may be implemented in low power and low cost systems without cooling requirements. Wide temperature ranges and operation variability due to aging components are also tolerated and compensated.

Furthermore, alarming and remote control features may be easily incorporated in the instant apparatus. Alarming including an analog/digital modulation depth alarm and a laser aging alarm may be implemented. For example, an analog modulation depth alarm may be constructed by monitoring the voltage drop across resistor 468 in FIG. 7. Too small a voltage drop indicates either the high speed signal level into laser driver 16 is excessive or the average laser bias current is too low. Too large a voltage drop indicates either the laser driver high speed input level is too low or that the average laser bias current is too high. The monitored voltage drop would then be compared, by operational amplifier circuits implementing a difference detector or comparator, to a reference voltage. When the sensed level is too high or too low with respect to the reference voltage, an alarm is sent to the system. Similarly, a digital modulation depth alarm may be constructed by monitoring the voltage drop across resistor 596 of FIG. 7. A laser aging alarm may be constructed by monitoring the voltage drop across resistor 190 of FIG. 4. An alternative to the operational amplifier difference detector or comparator circuit is to permit a microprocessor to monitor the voltage levels through an analog-to-digital converter and determine the alarm status. The microprocessor may then communicate the alarm status to the rest of the network.

Remote control or status monitoring capability implementation may require microprocessor control. Therefore, analog-to-digital and digital-to-analog converters may be used to monitor and provision the reference voltages used in the feedback paths. For example, the voltages at the junction of resistors 172-176 (FIG. 4) for average power reference voltage, at the junction of resistors 422-426 (FIG. 6) for digital modulation power reference voltage, and at the junction of resistors 402-406 (FIG. 6) for analog modulation power reference voltage, require provisionability. A calibration of the respective sensed feedback values with laser output parameters, such as optical output power, and optical modulation depth (ratio of peak-to-average optical power), is required. This allows the communication network to optimize the performance based on requirements of, for example, reducing DC power consumption or optimizing communication system signal-to-noise ratios under changing traffic loading conditions.

Although the present invention has been described in detail, it should be understood that various changes, substitutions and alterations can be made thereto without departing from the spirit and scope of the present invention as defined by the appended claims.

What is claimed is:

1. Apparatus for controlling the bias and modulation of a laser diode, comprising:
    a laser driver, coupled to said laser diode, for receiving low speed and high speed digital and analog input signals, and biasing and modulating said laser diode in response thereto;
    a monitor device responsive to an output from said laser diode and providing a laser output signal indicative of the magnitude thereof;
    an average bias power control circuit coupled to said monitor device and receiving said laser output signal, said average power control circuit averaging said received laser output signal, comparing said averaged signal with a predetermined reference average signal, and generating an average laser bias control signal in response to said comparison;
    a modulation power control circuit coupled to said monitor device and receiving said laser output signal, said modulation power control circuit detecting a maximum and a minimum peak therein, averaging said detected maximum and minimum peaks, comparing said maximum and minimum peaks with said averaged signal from said average bias power control circuit, and generating a digital modulation control signal and an analog modulation control signal in response to said comparison; and
    said laser driver receiving said average laser bias control signal and said digital and analog modulation control signals and driving said laser diode in response thereto.

2. The apparatus, as set forth in claim 1, wherein said average bias power control circuit comprises a lowpass filter coupled to said monitor device for generating a filtered output.

3. The apparatus, as set forth in claim 2, wherein said average bias power control circuit comprises:
    an averager coupled to said lowpass filter for comparing said filtered output with said predetermined reference average signal; and
    an average laser bias control circuit coupled to said averager and generating an average laser bias signal in response to said comparison.

4. The apparatus, as set forth in claim 1, wherein said modulation power control circuit comprises:
    a positive peak power detector receiving said laser output signal and detecting its maximum;
    a negative peak power detector receiving said laser output signal and detecting its minimum;
    an averager coupled to said positive and negative peak power detectors and generating a midpoint signal in response to the detected maximum and minimum; and
    a difference detector receiving said midpoint signal and said averaged output signal from said average bias power control circuit and generating a difference signal in response to a comparison therebetween.

5. The apparatus, as set forth in claim 4, wherein said modulation power control circuit further comprises a pre-emphasis circuit coupled to said monitor device for pre-distorting the laser output signal for said positive peak detector circuit.

6. The apparatus, as set forth in claim 4, wherein said modulation power control circuit further comprises a pre-emphasis circuit coupled to said monitor device for pre-distorting the laser output signal for said negative peak detector circuit.

7. The apparatus, as set forth in claim 1, wherein said monitor device includes a back facet monitor diode generating a photo-current in response to the output of said laser diode.

8. The apparatus, as set forth in claim 7, further comprising a current-to-voltage converter coupled to said back facet monitor diode for converting said photo-current into a photo-voltage.

9. The apparatus, as set forth in claim 1, further comprising a splitter circuit coupled to said monitor device for dividing said laser output signal.

10. Apparatus for controlling the bias and modulation of a laser diode, comprising:

a monitor device responsive to an output from said laser diode and providing a photo-current having a magnitude indicative of the laser diode output;

a low input impedance current-to-voltage converter coupled to said monitor device and converting said photo-current into a photo-voltage;

a power divider circuit coupled to said low input impedance current-to-voltage converter and producing three power output signals each having one-third power in response to said photo-voltage;

an average bias power control circuit coupled to said power divider and receiving one of said power output signals, said average power control circuit averaging said received power output signal, comparing said averaged power output signal with a predetermined reference average signal, and generating an average laser bias control signal in response to said comparison;

a modulation power control circuit coupled to said power divider and receiving two of said power output signals, said modulation power control circuit detecting a maximum and a minimum peak in said received power output signals, averaging said detected maximum and minimum peaks, comparing said maximum and minimum peaks with said averaged power output signal from said average bias power control circuit, and generating a digital modulation control signal and an analog modulation control signal in response to said comparison; and a laser driver, coupled to said average bias power control circuit and said modulation power control circuit and receiving low and high speed, digital and analog input signals, for biasing and modulating said laser diode in response to said average laser bias control signal, said digital and analog modulation control signals, and said low and high speed, digital and analog signals.

11. The apparatus, as set forth in claim 10, wherein said average bias power control circuit comprises:

a lowpass filter coupled to said monitor device and generating a filtered output;

an averager coupled to said lowpass filter for comparing said filtered output with said predetermined reference average signal; and an average laser bias control circuit coupled to said averager and generating an average laser bias signal in response to said comparison.

12. The apparatus, as set forth in claim 10, wherein said modulation power control circuit comprises:

a positive peak power detector receiving said laser output signal and detecting its maximum;

a negative peak power detector receiving said laser output signal and detecting its minimum;

an averager coupled to said positive and negative peak power detectors and generating a midpoint signal in response to the detected maximum and minimum; and a difference detector receiving said midpoint signal and said averaged output signal from said average bias power control circuit and generating a difference signal in response to a comparison therebetween.

13. A method for optimal linear operation of a laser diode, comprising:

receiving low and high speed, digital and analog input signals;

driving said laser diode in response to said received input signals;

monitoring the output from said laser diode and providing a laser output signal having a magnitude indicative of the laser diode output;

comparing an average of said laser output signal with a predetermined reference average signal and biasing said laser diode in response thereto;

comparing a midpoint of maximum and minimum peaks of said laser output signal with said average of said laser output signal, and modulating said laser diode in response thereto.

14. The method, as set forth in claim 13, further comprising the step of removing high frequency signals from said laser output signal and generating an average signal.

15. The method, as set forth in claim 13, further comprising the steps of:

detecting a maximum peak of said laser output signal;

detecting a minimum peak of said laser output signal; and determining a midpoint between said detected maximum and minimum.

16. A method for controlling the bias and modulation of a laser diode, comprising:

receiving low and high speed, digital and analog input signals;

driving said laser diode in response to said received input signals;

monitoring the output from said laser diode and providing a laser output signal having a magnitude indicative of the laser diode output;

averaging said laser output signal;

comparing said averaged laser output signal with a predetermined reference average signal and generating an average laser bias control signal in response thereto;

detecting a maximum and a minimum in said laser output signal, averaging said detected maximum and minimum, comparing said maximum and minimum peaks with said average laser bias control signal, and generating a digital modulation control signal and an analog modulation control signal in response to said comparison;

biasing said laser diode in response to said average laser bias control signal; and modulating said laser diode in response to said digital and analog modulation control signals.

* * * * *